United States Patent [19]

Hamaguchi

[11] Patent Number: 4,625,121
[45] Date of Patent: Nov. 25, 1986

[54] METHOD OF ELECTRON BEAM EXPOSURE

[75] Inventor: Shin-ichi Hamaguchi, Machida, Japan

[73] Assignee: Fujitsu Limited, Kawasaki, Japan

[21] Appl. No.: 704,515

[22] Filed: Feb. 22, 1985

[30] Foreign Application Priority Data

Feb. 29, 1984 [JP] Japan .................................. 59-37934

[51] Int. Cl.⁴ .............................................. H01J 37/30
[52] U.S. Cl. ................................................. 250/492.2
[58] Field of Search ............................. 250/398, 492.2

[56] References Cited

U.S. PATENT DOCUMENTS

| | | | |
|---|---|---|---|
| 4,433,384 | 2/1984 | Berrian | 250/492.2 |
| 4,477,729 | 10/1984 | Chang et al. | 250/492.2 |
| 4,482,810 | 11/1984 | Cooke | 250/492.2 |

Primary Examiner—Bruce C. Anderson
Attorney, Agent, or Firm—Staas & Halsey

[57] ABSTRACT

A method for improving the throughput of precision pattern generation using intermittent shots of an electron beam. The shot applied to the periphery of the region to be occupied by the pattern occurs after a relatively long blanking time starting after the directly preceding shot, while the shot applied to the inner portion of the region occurs after a relatively short blanking time starting after the directly preceding shot.

8 Claims, 6 Drawing Figures

METHOD OF ELECTRON BEAM EXPOSURE

BACKGROUND OF THE INVENTION

The present invention relates to a method of electron beam exposure and, more specifically, relates to a method for improving the throughput of a precision pattern generation using electron beam exposure.

The patterning of resist films is essential in the manufacturing of semiconductor devices. That is, many resist films are used as the masks in various etching processes, for example, the fabrication of windows in an insulating layer on a semiconductor substrate, which are used for defining the selective diffusion regions, or the fabrication of fine metallic wiring lines on a semiconductor device.

Such patterning has usually been performed by exposing the resist film to ultra-violet (UV) light passed through a photo-mask, therefore, such technology is referred to as photolithography. However, the recent requirement for the fine patterning on the order of sub-microns in semiconductor devices makes electron beam (EB) technology (referred to as EB lithography) indispensable. The EB permits direct writing of a number of patterns on the order of a micron or sub-micron in a resist film formed on a semiconductor wafer, or in a resist film formed on a glass substrate to be used as a photo-mask in the ordinary photolithographic process.

The most popular of the EB lithography techniques is that an electron beam converged to micron or sub-micron size is scanned over each predetermined region of a resist film, in which a desired pattern is generated. There are two types of EB scanning: a raster scanning of a continuous EB as thin as 0.5 micron, for example, and a stepwise scanning of an EB having relatively wide cross-section, usually rectangular beam on the order of a few microns, wherein the EB is intermittently energized to expose each fraction of the region in a step-and-repeat mode.

FIG. 1 is an enlargement of a partial plan view of an exemplary pattern layout in a photo-mask. Each hatched area constitutes an island-like pattern of an opaque material such as metallic chromium film formed on a glass substrate 1. As one of the smallest dimensions in FIG. 1, the pattern 2, for example, has a linear portion of width "d" of 10 microns or less between ends 21 and 22. The images of these patterns are projected on the resist film formed on a silicon wafer in a demagnification factor of x1/5, for instance. Hence, the actual pattern having the minimum width of 2 micron corresponding to "d" can be formed on the wafer.

FIG. 2 is a conceptual diagram for explaining a method for writing an L-shaped pattern in FIG. 1 by scanning with intermittent shots of an electron beam. Such a complex pattern as the L-shape is usually partitioned into imaginary rectangular patterns, and each rectangular pattern is written by the intermittent shots of an electron beam scanned over each rectangular region in a step-and-repeat mode. That is, in FIG. 2, the region occupied by the L-shape pattern is partitioned into the rectangular regions 3 and 4, each comprising a plurality of respective sub-regions 31 or 41. Each of the sub-regions 31 or 41 has a size determined by the respective equal-length fractions of the sides of the region 3 or 4, and is subjected to the exposure of a single shot of an electron beam having a cross-section of the same size as that of the sub-region.

In FIG. 2, the initial shot of an electron beam is applied to the sub-region 310, which is selected as the origin to define the rectangular region 3, and the successive shots are stepwisely scanned over the region 3 along the arrow-headed lines. The scanning of the shots is usually (but not necessarily) performed along the longer side of the rectangular region except in the transition to the next scanning line. After the completion of the exposure of all sub-regions 31 to the shots, the electron beam is aligned with the sub-region 410, which is selected as the origin to be subjected to the initial shot to the region 4. And then, the intermittent shots of the EB begin to be stepwisely scanned over the region 4 along the arrow-headed lines. Thus, all sub-regions 31 of the region 3 and all sub-regions 41 of the region 4 are subjected to exposure of the intermittent shots of the electron beam, and the L-shape pattern is generated in the resist film.

However, it has been observed that a pattern generated in a resist film often spreads beyond the designed area, as shown in FIG. 3, which illustrates a rectangular pattern 5 (area surrounded by the solid line). The pattern 5 has been generated in the manner as described with reference to FIG. 2. In FIG. 3, the initial shot of an electron beam was applied to the sub-region 510 (hatched area), and subsequent shots were applied to each sub-region 51 (area defined by the dotted lines) along the arrow-headed lines. This spreading increases stepwisely in the sub-regions corresponding to a few shots (2 or 3 shots) after the initial shot to the sub-region 510 and becomes constant at the subsequent sub-region, for example, the sub-region 511. In FIG. 3, if the designed size of the sub-region 51 is 3 microns square, for example, then the maximum spreading may be 0.2 micron at each side. Accordingly, the region 5 (resulting pattern) has an error of 0.4 micron relative to its designed size.

The spreading is more often observed in the resist film formed on a glass substrate and less often observed in the resist film formed on a silicon wafer. And, as mentioned above, the spreading increases within the two or three sub-regions neighboring the starting sub-region at which exposure by the shots has been initiated, and becomes constant in the subsequent sub-regions. Moreover, the spreading is not observed if a sufficiently lengthy pause (blanking period) is provided between the successive shots.

The above facts suggest that the spreading can be caused by a residual effect relating to the shots to the proceeding sub-regions, however, it is not yet clear what causes the residual effect, whether the residual effect affects the shot size of the electron beam or not, and what is the range of the sub-regions subjected to the residual effect of the shot for the proceeding sub-regions. The residual effect also seems to occur in reaction to an attempt to compensate for the effect as it accumulates to a certain degree.

The above-mentioned error of 0.4 micron in the size of the resulting pattern is comparatively large for a master photo-mask (reticle) and decreases the production yield of the relevant semiconductor devices. This is considered to be due to the non-linear interference effect of the optical patterns on the order of a micron or sub-microns, caused by the demagnifying process of the reticle pattern such as shown in FIG. 1.

Such spreading in the resulting pattern could be achieved by controlling the size or dosage of the EB shot to each sub-region, resulting in increased program steps of the control system and decreased throughput.

The EB shot-size- or dosage-controlling involves: (1) the necessity of checking the varied shot size or EB dosage together with the accompanying shot size change, and providing feedback of the checking results to the control system; and (2) the necessity of analog voltage control according to every step of the shot size or dosage checking. Such controlling suffers from poor tolerance for the process condition variables relating to the characteristics of the resist film and the substrate, for example, the material, thickness, sensitivity, etc. of the resist film and the thermal and electric conductivities of the substrate.

Therefore, it is preferable to use an EB shot of constant size and dosage in order to simplify the process control. As mentioned above, the spreading can be avoided by providing a sufficiently lengthy pause (blanking time) between every successive EB shot, but there is a trade-off between the pattern accuracy and the throughput in the pattern generation.

SUMMARY OF THE INVENTION

It is the primary object of the present invention to provide an EB exposure method for generating a precision pattern.

It is another object of the present invention to provide an EB exposure method for generating a precision pattern without a substantial decrease in the throughput.

It is still another object of the present invention to provide an EB exposure method for generating a precision pattern by using an EB of constant size and dosage without a substantial decrease in throughput.

The above objects can be attained by providing an EB exposure method for generating an island-like pattern consisting of a region to be exposed to an EB which is surrounded by an unexposed region, the method comprising the steps of: providing sequentially intermittent shots of the EB to a plurality of sub-regions defined by subdividing the island-like pattern; subjecting the sub-region at the periphery of the island-like pattern to a shot with a first pause after a preceding shot; and subjecting the sub-region at the inner portion of the island-like pattern to a shot with a second pause shorter than the first pause after a preceding shot.

DETAILED DESCRIPTION OF THE PREFERRED EMBODIMENTS

Figure 3:
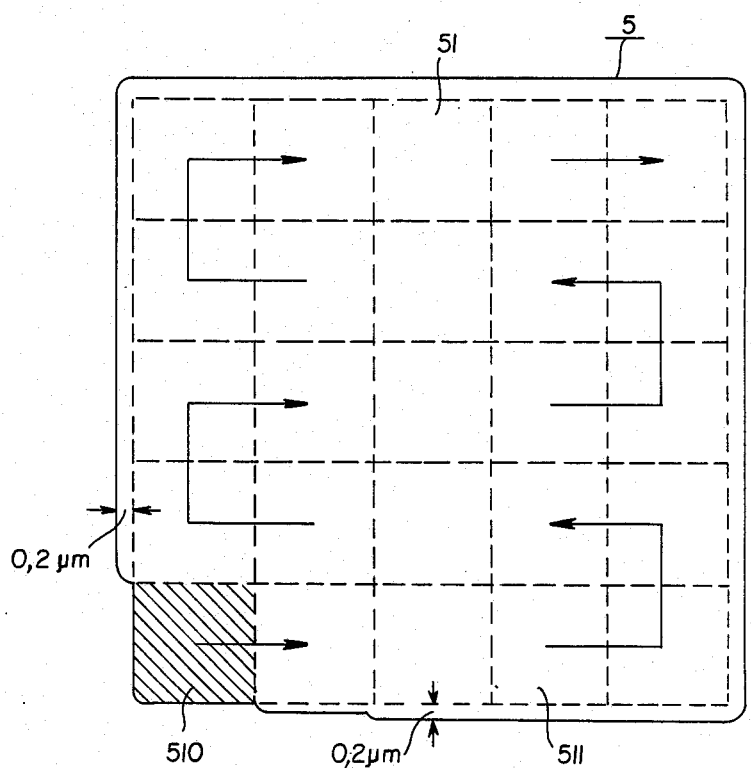
FIG. 3 is an enlarged, plan view illustrating a conventional rectangular pattern generated in the manner as described with reference to FIG. 2.

The pattern shown in FIG. 3 is generated by the shots of an electron beam having the size of 3 microns square, for example, and operating with the shot duration of 1 $\mu$sec and blanking time of 0.5 $\mu$sec. As mentioned above, the spreading of the pattern does not occur if a sufficient blanking time, for example, 4 $\mu$sec is allowed therebetween. Also observed is that the effect of an EB shot to a sub-region is not so strong that it does not affect the resist film in the sub-regions having already been subjected to the exposure. And further, it is apparent from the pattern shown in FIG. 3 that the shots to the sub-regions other than those positioned at the periphery can be performed substantially without concern for spreading of the pattern. This means that such spreading can be avoided if the aforesaid residual effect of the shot for the preceeding sub-regions can be eliminated for the shot to the periphery of the pattern 5. Therefore, the blanking time must be long only for the shot prior to the peripheral pattern, and may be relatively short for other parts of the periphery.

Figure 4:
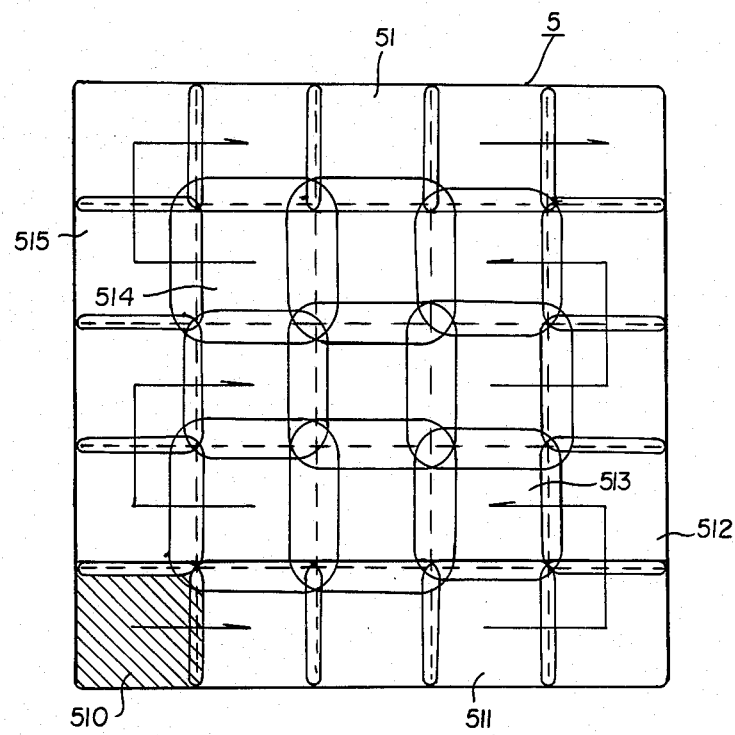
FIG. 4 is an enlarged, plan view illustrating a rectangular pattern exposed according to the present invention.

FIG. 4 illustrates a rectangular pattern exposed using the method of the present invention based on the above theory. In FIG. 4, the blanking time between the respective shots to the sub-regions from 510 through 511 to 512 should be long, while the blanking time between the respective shots to the sub-regions 512 and 513 can be relatively short. Also, the blanking time between the sub-regions 514 and 515 should be long enough to shield the sub-region 515 from the residual effect of the shot to the sub-region 514. As shown in FIG. 4, each exposed area of each sub-region at the periphery is smaller than that of each sub-region at the inner portion.

Figure 5:
FIG. 5 is a graphic view illustrating the timing chart of the EB shot control signal.

FIG. 5 is an exemplary timing chart of the signal for controlling the blanking time between the EB shots according to the present invention. During each high level of the signal, the EB shot is applied to a single sub-region, while each low level of the signal corresponds to the above-mentioned blanking time. The positioning of the electron beam is performed in the blanking period. With cross-reference to FIGS. 4 and 5, $P_{512}$ and $P_{513}$ correspond to the EB shots to the sub-regions 512 and 513, respectively, while $P_{514}$ and $P_{515}$ correspond to the EB shots to the sub-regions 514 and 515, respectively. The exemplary pulse width (high level) is 1 $\mu$sec, the blanking time (low level) between $P_{512}$ and $P_{513}$ is 0.5 $\mu$sec and that between $P_{514}$ and $P_{515}$ is 4 $\mu$sec.

Establishing the correlations between the shots and the length of the blanking time, and controlling the length of the variable blanking time can easily be performed with higher throughput than conventional techniques involving the aforesaid EB shot size controlling or EB dosage controlling because of the reason mentioned before.

Figure 6:
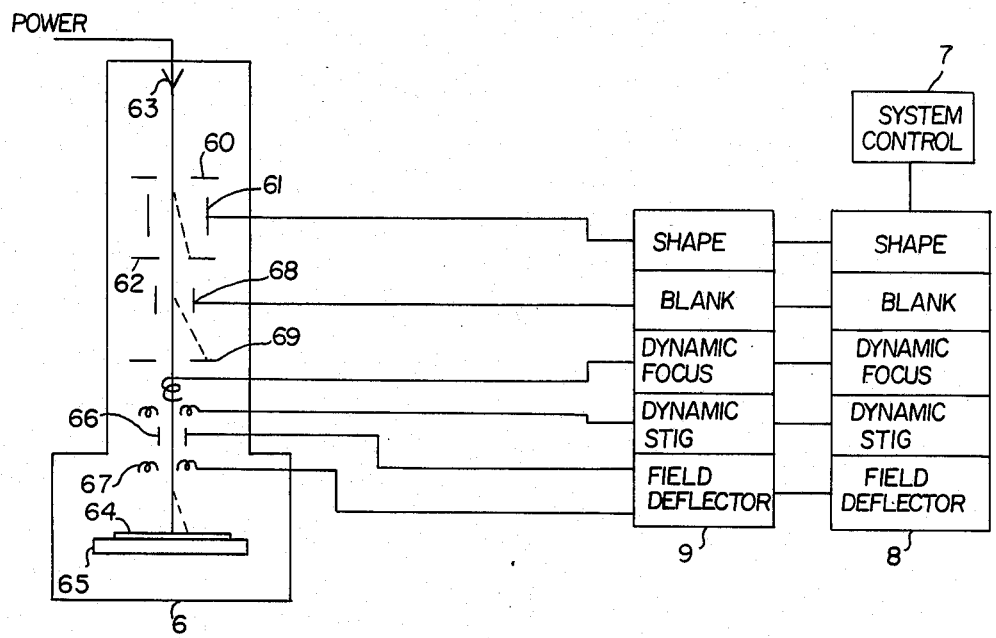
FIG. 6 is a diagrammatic view illustrating the EB system according to the present invention.

FIG. 6 is a conceptual block diagram of the EB system used in the present invention. The system of FIG. 5 is not significantly different from those used in the conventional EB exposure processes. Accordingly only the following simplified description regarding its configuration and operation will be given.

The system shown in FIG. 6 comprises an EB column 6, a system control 7, a sub-control system block 8 and a D/A converter block 9. In the EB column 6, the beam shaping means comprises a first square aperture 60, a shaping deflector 61, and a second square aperture 62 which trims the electron beam formed by the electron gun 63 and provides an electron beam (EB) having desired shape and size according to the signal supplied by the SHAPE. After focussing and anastigmatic corrections are made by the DYNAMIC FOCUS and DYNAMIC STIG, respectively, the shaped EB is subjected to deflection for the scanning on the substrate 64 placed on an X-Y stage 65. The electrostatic deflection means 66 is responsible for high speed scanning in an area smaller than a few hundred microns, while the relatively low speed electromagnetic deflection means 67 is used for EB position registration control ranging from a few hundred microns to a few millimeters. Both of these deflections are controlled by the FIELD DEFLECTOR.

The blanker 68 deflects the shaped beam to be absorbed by the final aperture 69 according to the signal as shown in FIG. 4 under the control of the BLANK, thus providing the intermittent EB shots having predetermined variable blanking times.

In the EB exposure method of the present invention, the system control 7 always checks the coordinate data of each sub-region to be subjected to the next EB shot, and commands the BLANK in the sub-system control 8 to add a predetermined increment of time to the normal blanking time (0.5 $\mu$sec, for example), if it judges that the subject coordinate data includes at least one of the coordinate components defining the contour of the pattern to be generated. The 1 $\mu$sec of EB shot to the preceding sub-region and the following blanking time of at least 0.5 $\mu$sec is enough time to allow checking of the coordinate data of the subsequent sub-region. Accordingly, an increase in the time required for the pattern generation arises only from the increment in the blanking time. In other words, the present invention allows a decrease in the pattern generation time by reducing the blanking times prior to the shots to the sub-regions other than those at the periphery of the pattern, as compared with the prior art precision pattern generation method wherein the blanking time is equally long for every shot, such as 4 $\mu$sec.

The following is the pattern generation time comparison and the time reduction obtained by the present invention.

| No. of Sub-regions | Prior Art ($\mu$sec) | Present Invention ($\mu$sec) | Time Reduction (%) |
|---|---|---|---|
| 3 × 3 | 32 + 9 = 41 | 28.5 + 9 = 37.5 | 8.5 |
| 4 × 4 | 60 + 16 = 76 | 46 + 16 = 62 | 18.4 |
| 5 × 5 | 96 + 25 = 121 | 62.5 + 25 = 87.5 | 27.6 |

When the pattern has a length much greater than the width, the time reduction is approximately given as $(70+140/n)\%$, where n denotes the number of sub-regions in the direction of the width. Therefore, if the pattern is written by the three rows of the sub-regions (i.e. n=3), the time reduction results in 23%, and if it is written by the four rows (i.e. n=4), the time reduction of 35% can be achieved, for example.

Figure 1:
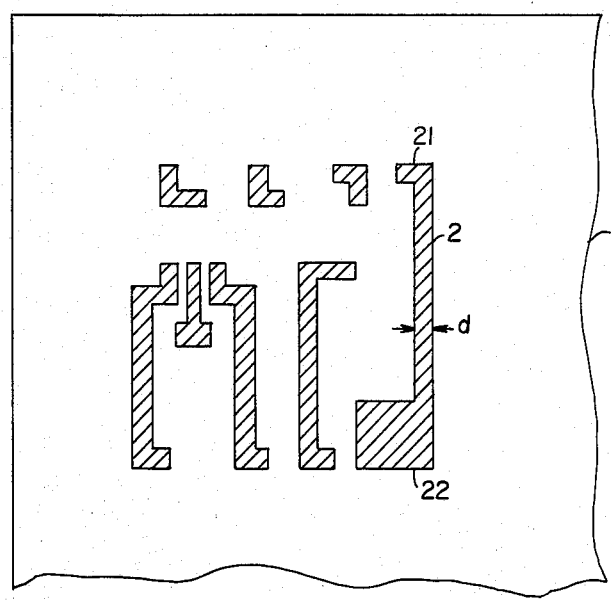
FIG. 1 is an enlarged partial, plan view of a conventional pattern layout on a semiconductor wafer.
Figure 2:
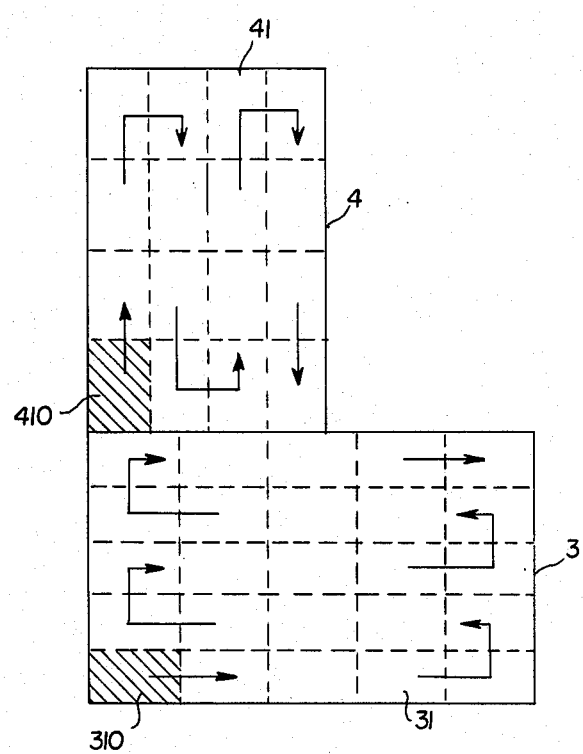
FIG. 2 is an enlarged, plan, view of a conventional L-shaped pattern written by a scanned electron beam.

As mentioned before, the complicated pattern is partitioned into plural rectangular patterns. For example, to generate an L-shaped pattern as shown in FIG. 2, the region occupied by the pattern is partitioned into two rectangular regions 3 and 4. In this case, the EB shots to the sub-regions 31 and 41 lying close to the boundary of the rectangular regions 3 and 4 are indifferent to the aforesaid spreading due to the residual effect. Therefore, the reduction in the time required for the pattern generation can be decreased further. That is, the point of the present invention is that the blanking time prior to the EB shot for a sub-region at the periphery of an island-like pattern can be short, compared to the blanking time prior to the EB shot for a sub-region at the inner portion of the pattern, when the island-like pattern is an exposed region surrounded by an unexposed region.

While the described embodiment represents the preferred form of the present invention, it is to be understood that modifications will occur to those skilled in the art without departing from the spirit of the invention. The scope of the invention is therefore to be determined solely by the appended claims.

I claim:

1. A method for energy beam exposure of an island-like pattern including a region to be exposed to said energy beam which is surrounded by an unexposed region, said method comprising the step of:
   providing sequentially intermitent shots of said energy beam to a plurality of sub-regions at the periphery and the inner portion of said island-like pattern defined by subdividing said island-like pattern, said step including the following steps;
   subjecting said sub-regions at the periphery of said island-like pattern to a shot with a first blanking pause after a preceding shot, and
   subjecting said sub-regions at the inner portion of said island-like pattern to a shot with a second blanking pause shorter than said first blanking pause after a preceding shot.

2. A method for energy beam exposure as recited in claim 1, wherein said energy beam is an electron beam.

3. A method for energy beam exposure as recited in claim 1, wherein said island-like pattern further comprises a rectangular region composed of a plurality of rectangular sub-regions, each having a shape and size proportional to said rectangular region.

4. A method for energy beam exposure as recited in claim 1, wherein said island-like pattern further comprises a plurality of rectangular regions, each of which has a plurality of rectangular sub-regions with a shape and size proportional to the corresponding rectangular regions.

5. A method for energy beam exposure as recited in claim 1, wherein said energy beam is a fixed-shaped beam.

6. A method for energy beam exposure as recited in claim 1, wherein said energy beam is a variable-shaped beam.

7. A method for energy beam exposure as recited in claim 1, wherein each shot of said energy beam has a shape and size equal to said sub-region to which the shot is applied.

8. A method for energy beam exposure as recited in claim 3, wherein the length of said first pause prior to the shot to said sub-regions is relative to the area of the shot to a sub-region directly preceding said sub-region.

* * * * *